United States Patent [19]

Noguchi et al.

[11] Patent Number: 4,840,487
[45] Date of Patent: *Jun. 20, 1989

[54] MEASURING APPARATUS FOR ETCHING PITS

[75] Inventors: Minori Noguchi, Yokohama; Toru Otsubo, Fujisawa; Susumu Aiuchi, Yokohama, all of Japan

[73] Assignee: Hitachi, Ltd., Tokyo, Japan

[21] Appl. No.: 875,980

[22] Filed: Jun. 19, 1986

[*] Notice: The portion of the term of this patent subsequent to Oct. 7, 2003 has been disclaimed.

[30] Foreign Application Priority Data

Jun. 19, 1985 [JP] Japan .............................. 60-131761

[51] Int. Cl.$^4$ ............................................. G01B 11/22
[52] U.S. Cl. ...................................... 356/355; 356/31; 356/384
[58] Field of Search ............... 356/378, 384, 354, 355, 356/445, 447, 31

[56] References Cited

U.S. PATENT DOCUMENTS

| | | | |
|---|---|---|---|
| 2,423,357 | 7/1947 | Watrobski | 356/31 |
| 4,303,341 | 12/1981 | Kleinkrecht et al. | 356/384 |
| 4,412,345 | 10/1983 | Workman et al. | 356/31 |
| 4,454,001 | 6/1984 | Sternheim et al. | 356/355 |
| 4,615,620 | 10/1986 | Noguchi et al. | 356/355 |
| 4,618,262 | 10/1986 | Maydan et al. | 356/357 |

Primary Examiner—Richard A. Rosenberger
Attorney, Agent, or Firm—Antonelli, Terry & Wands

[57] ABSTRACT

An apparatus for measuring dry etching pits formed in a semiconductor device during the manufacture thereof by employing optical means. Wiring on semiconductor devices increasingly become fine or minute, i.e., the size of wiring of some devices is less than 1 μm. A technical matter to be solved is to effect highly accurate dimensional measurement in such submicron region. The apparatus has a θ stage which is additionally provided on an XY stage, and a mechanism which provides excellent selectivity in detection of interference intensity of diffracted beam. In addition, a short wavelength laser, such as a He-Ne, He-Cd, $N_2$ or Ar laser, is employed as a laser source. As a practical advantage, it is possible to monitor etching of a pit with a depth on the order of 10 μm with respect to a pattern with a planar dimension of 0.3 μm to 1.0 μm.

10 Claims, 4 Drawing Sheets

MEASURING APPARATUS FOR ETCHING PITS

BACKGROUND OF THE INVENTION

The present invention relates to an apparatus for carrying out inspection or analysis of a material by using an optical means. More particularly, the present invention pertains to an apparatus which enables in situ measurement of etching pits during a dry etching process for manufacturing semiconductor devices.

Semiconductor devices are now widely employed in electronic apparatuses for improving controllability in general existing techniques. In order to store a large amount of data and to process data at high speed, semiconductor devices are demanded to increase in the scale of integration and become finer or more minute. In such circumstances, the changeover from the conventional planar element structure to a three-dimensional element structure is one of the technical matters which need to be solved.

To this end, it is necessary to form pits or grooves with a width of 0.5 to 2.0 μm and a depth of 1.0 to 10 μm in the surface of a semiconductor substrate. Since it is impossible to form such pits or grooves using conventional chemical solutions, it may be necessary to employ a dry etching technique using a gas which is reactive to the semiconductor substrate. However, it is difficult to set up the dry etching condition. And it is necessary to effect in-process monitoring of the etching. More practically, it is necessary to monitor in situ the etching of deep grooves or deep pits.

There is known literature describing optical monitoring of the etching of a semiconductor substrate, titled "Optical Monitoring of the Etching of $SiO_2$ and $Si_3N_4$ on si by the Use of Grating Test Patterns", H. P. Kleinknecht & H. Meier, the May 1973 issue of Solid State Science & Technology.

In this method, the beam of a He-Ne laser is aimed at a test pattern containing one or more diffraction gratings prepared in advance, and changes in the reflected first-order diffraction intensities are monitored, thereby allowing the etch rate and the etch depth to be recorded. This method suffers, however, from the following problem. As the width of a pattern to be measured decreases, the change in the diffraction interference intensity becomes small, so that it becomes impossible to effect satisfactory monitoring. It may be considered that such problem occurs owing to the fact described below. As the pattern width decreases, the size of the He-Ne laser beam (wavelength: about 0.6 μm) and the size of a groove or pit which is irradiated with the laser beam become substantially equal to each other, and the intensity of the reflected light itself consequently becomes weak in the macroscopic observation. There is another conventional method in which a test pattern for monitoring the etching is formed on an object of irradiation in advance, and the etching of the test pattern is regarded as identical with the actual etching on the semiconductor device. This method cannot, however, satisfactorily cope with the demand for a higher degree of accuracy which arises from the increase in scale of integration of semiconductor devices. This is because the etching rate strongly depends on the etching dimensions.

BRIEF SUMMARY OF THE INVENTION

It is an object of the present invention to provide an apparatus for effectively and accurately measuring etching pits by employing a light source having a small absorptivity with respect to a groove or pit as an object of irradiation in order to ensure a satisfactory change in the interference intensity of the diffracted light which is reflected from the object.

In general, the shorter the wavelength of light, the higher the reflectance in macroscopic observation. It has been confirmed in the present invention that the above general principle is also applicable to a deep pit or groove formed in the surface of a semiconductor substrate. More specifically, the results of examination of the wavelength of irradiation and the absorptivity at an object of measurement (which is also an object of irradiation) found that, the shorter the wavelength, the smaller the absorptivity.

According to the present invention, therefore, there is prepared a detector means which is capable of accurately detecting the diffracted light which is reflected from an object of irradiation, more practically, a detector means which is provided with the freedom of movement in two axial directions which are perpendicular to each other and in the direction of rotation. In addition, as a laser source a He-Cd, $N_2$ or Ar laser may be employed in addition to a He-Ne laser to detect changes in ther interference intensities, and the etch depth is calculated on the basis of the detected changes.

DETAILED DESCRIPTION OF THE PREFERRED EMBODIMENTS

One preferred embodiment of the present invention will be described hereinunder after a brief explanation of the relationship between the orifice measurement of a pit or groove formed in the surface of a semiconductor substrate, the wavelength of irradiation and the amount (contrast) of change in the intensity of interference between diffracted rays on the basis of experimental facts (see FIGS. 2 and 3).

Figure 2:
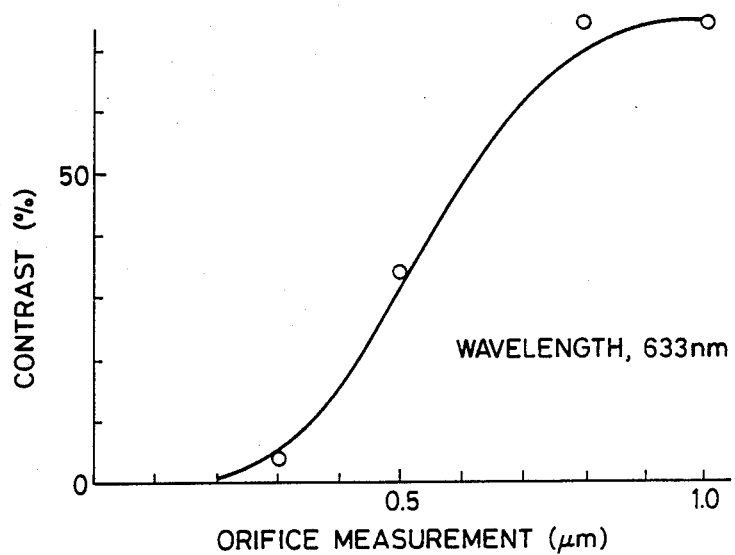
FIG. 2 is a graph showing the relationship between the orifice measurement of a pit formed in the surface of a semiconductor substrate and the amount (contrast) of change in the intensity of interference between diffracted rays.
Figure 3:
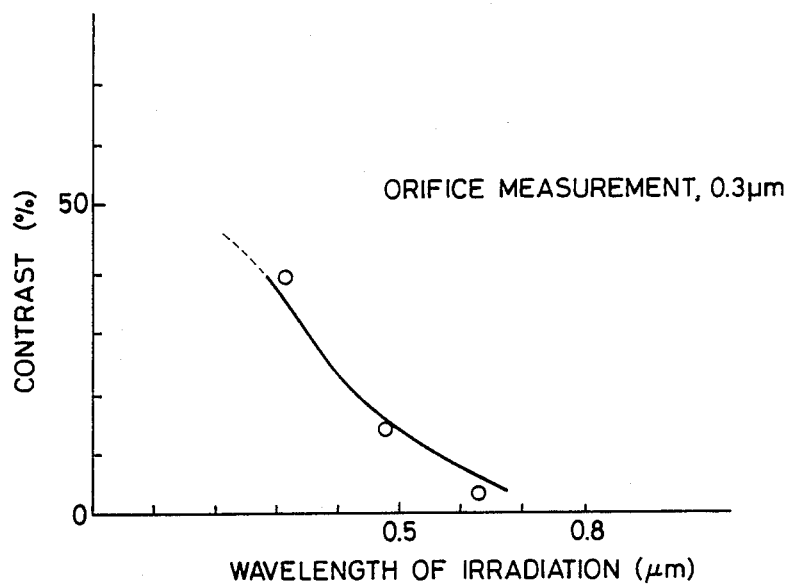
FIG. 3 is a graph showing the relationship between the wavelength of irradiation and the amount (contrast) of change in the intensity of interference between diffracted rays.

FIG. 2 is a graph showing the relationship between the amount (contrast) of change in the intensity of interference between diffracted rays and the orifice measurement of a pit formed in the surface of a semiconductor substrate in one example of the present invention in which a He-Ne laser of 633 nm wavelength is employed. The graph shows the amount of change in the case where the depth of the pit is about 1 μm. It will be seen from the graph that the contrast lowers in an orifice measurement range from 0.5 μm to 0.3 μm. FIG. 3 is a graph showing changes in contrast measured when a pattern with an orifice dimension of 0.3 μm is irradiated with beams of light having different wavelengths. The depth of the pit is also about 1 μm. When the wave length of irradiation is 325 nm, the contrast is about 40%, and this can satisfactorily be detected. These experimental facts show that it is preferable to employ a He-Cd laser for measurement of a pattern with an orifice dimension on the order of 0.3 μm.

Figure 1:
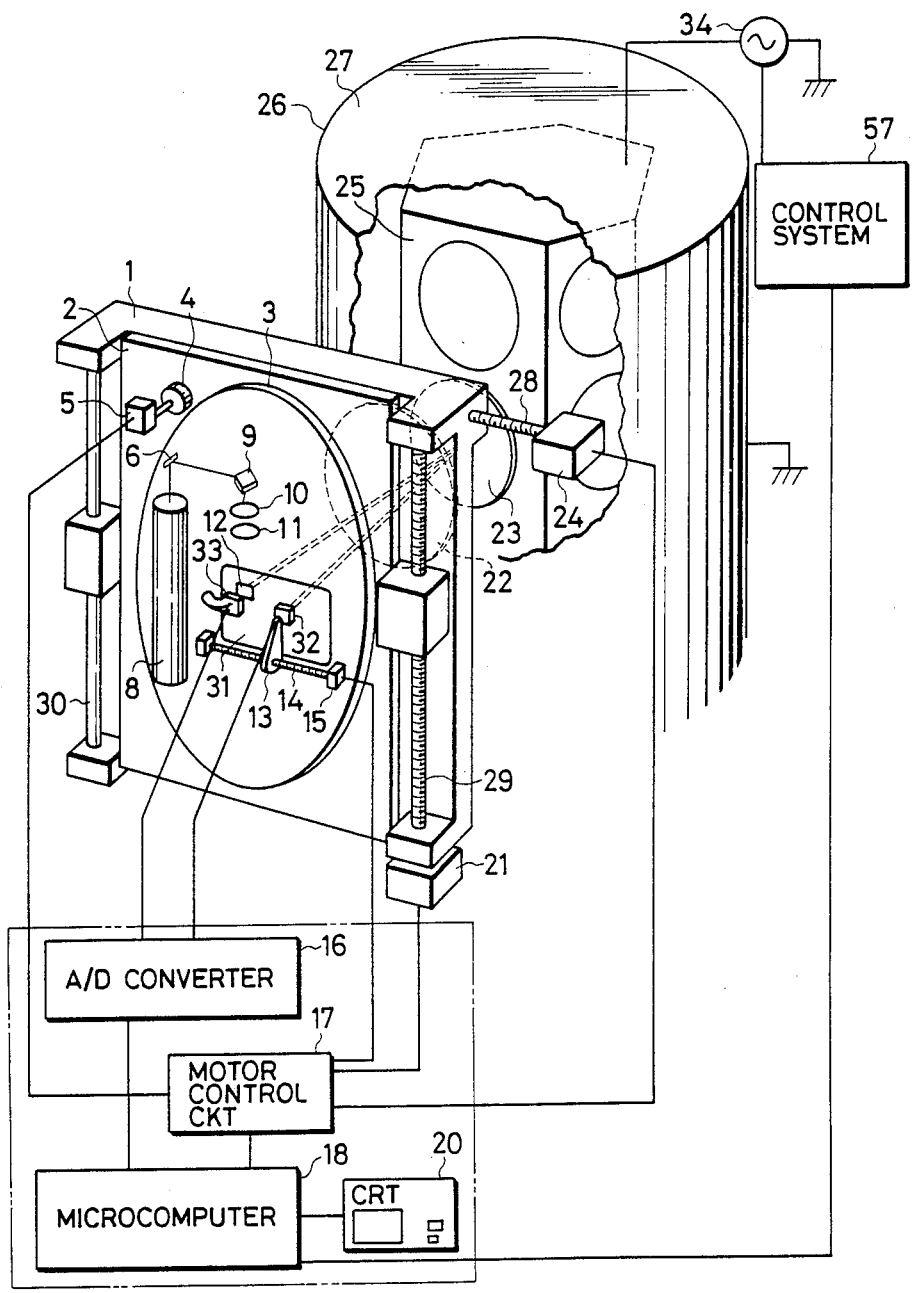
FIG. 1 shows the arrangement of an essential part of one embodiment of the present invention.

FIG. 1 shows the general arrangement of one embodiment of the present invention.

In this embodiment, a stage section is composed of a support frame, an X-stage 1 supported so as to be movable in a X-direction on the support frame, a driving motor 24 for moving the X-stage 1 through a ball screw 28, a Y-stage 2 supported movably in a Y-direction on the X-stage 1 along a guide 30 and a ball screw 29, a θ (rotating) stage 3 supported rotatably on the Y-stage 2, a driving motor 5 for rotating the θ (rotating) stage 3 through a gear 4, an arm 13 mounted with a photodetector 32, and a driving motor 15 for moving the arm 13 in a radial direction on the θ (rotating) stage 3 through a ball screw 14. The θ (rotating) stage 3 is mounted with a He-Cd laser source 8, mirrors 6, 9, lenses 10, 11, a half-mirror 12 and a photodetector 33 and provided with a ground glass 31. The half-mirror 12 and photodetector 33 are positioned at a rotating center of the θ (rotating) stage 3. A light irradiating section is composed of the He-Cd laser source 8, mirrors 6, 9, lenses 10, 11 and a half-mirror 12. An arithmetic control section is composed of an A/D converter 16, a motor control circuit 17, a microcomputer 18 and a CRT 20.

The embodiment shown in FIG. 1 exemplifies an arrangement in which the present invention is applied to a dry etching apparatus which comprises an anode 25, a cathode 26, a low-pressure processing chamber 27, a high-frequency power supply 34, a control system 57 and a window 22.

The mirrors 6 and 9 are so designed to reflect also an ultraviolet ray of 325 nm wavelength. More practically, these mirrors have SiO$_2$ coating on the Al film provided by evaporation. The half-mirror 12, the ground glass 31 and the lenses 10, 11 are made of quartz so that they pass ultraviolet rays. It is necessary for the window 22 of the dry etching apparatus to be also made of quartz for the same reason. In addition, as each of the photodetectors 32, 33 also, one which is sensitive to light of 325 nm wavelength is selected.

The processing procedure is as follows.

A wafer 23 is disposed on the anode 25, and the low-pressure processing chamber 27 is set up under predetermined processing conditions.

Either the He-Ne laser or He-Cd laser 8 is then turned on. The beam of laser is reflected by the mirrors 6, 9 and passed through the lenses 10, 11. The resultant parallel beams of about 5 to 10 mm diameter are reflected by the half-mirror 12 and passed through a transparent portion (not shown) on the ground glass 31 and the window 22 to irradiate the surface of the wafer 23.

The beams applied to the surface of the wafer 23 are reflected and diffracted so as to interfere with each other by a regular pattern on the wafer 23, as described later, and reach the ground glass 31 through the window 22. This light is diffused in the surface of the ground glass 31 and detected by the photodetector 32.

The position of the photodetector 32 is determined as desired by rotating the θ stage 3 and changing the position of the arm 13. It is therefore possible to detect any desired light emerging from the window 22.

The position on the wafer 23 which is irradiated with the laser beam reflected by the half-mirror 12 and passed through the ground glass 31 and the window 22 can be determined as desired by driving the motors 21, 24 for the x and y stages 1 and 2.

Light which is not diffracted by the surface of the wafer 23 but reflected specularly from the wafer surface (th-order diffraction light) is passed through the half-mirror 12 and detected by the photodetector 33. Light of nth-order diffraction is detected by the photodetector 32 by changing the position of the arm 13 through the ball screw 14 driven by the motor 15.

The light detected by the photodetectors 32, 33 is subjected to photoelectric conversion and then delivered through the A/D converter 16 to the microcomputer 18 where data processing is carried out.

Figure 4:
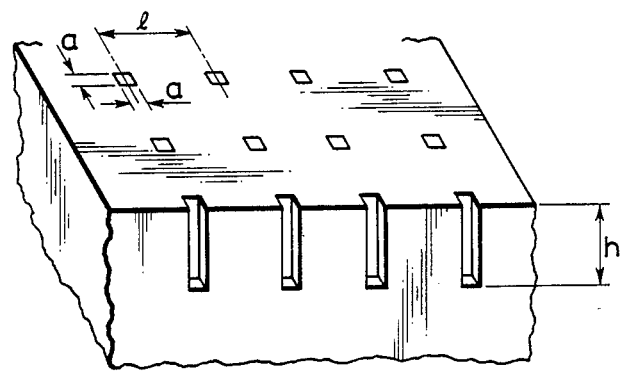
FIG. 4 is a perspective view of one example of an object of measurement.

The operation of the apparatus according to the present invention will be explained below through the process for etching a semiconductor device on which a pattern shown in FIG. 4 is disposed, by way of example.

Let us consider a case where light is applied to a pattern on a semiconductor substrate during the etching process, such as that shown in FIG. 4. In this pattern, pits with an orifice of a[μm]×a[μm] and a depth h[μm] are sequentially arranged at a pitch l[μm]. It is assumed that the total area of the pits in a laser sput is represented by b, and the total area of a surface portion in the laser spot excluding the pits is represented by s.

When light is perpendicularly applied to this pattern over a wide range, the rays of light reflected by the surface of the semiconductor substrate form a diffraction pattern by virtue of the regularity of the pattern on the surface.

It is assumed that, the central figure in this diffraction pattern is referred to as "Oth-order diffraction figure" and diffraction figures which are disposed outwardly of the central figure are sequentially referred to as "first-order diffraction figure", "second-order diffraction figure", . . . , "nth-order diffraction figure", and the respective light intensities are denoted by $I^1, I^2, \ldots, I^n$. $I^n$ represents the intensity of interference between the light reflected from the bottom of each of the pits and diffracted by the orifice of the pit and the light reflected and diffracted by any portion other than the pits. The respective intensities of these two light rays which interfere with each other are denoted by $Ib^n$ and $Is^n$. It is further assumed that the light entering a pit attenuates and emerges from the pit with an α-fold intensity ($\alpha < 1$)

In such model, pit orifices and the other portion of the surface of the object define complementary patterns which are just similar to those based on the Babinet's principle.

The present invention makes a use of the Babinet's principle that diffraction patterns in the Fraunhofer's area formed by two complementary patterns (two black and white inverted patterns) have equal light intensities and are π out of phase with each other except for one diffraction figure (Oth-order diffraction figure) at the center of the diffraction patterns.

In practice, as a matter of course, when the light which is reflected from the bottom of a pit emerges from the pit, the wave surface of this light is disordered and therefore is not the same as that of the light when entering the pit. Accordingly, the two patterns are not completely complementary to each other but may be regarded as approximately complementary patterns. Therefore, the following formula holds:

$$\alpha I^n = I^n \quad (1)$$

From the area ratio between the pit portion and the other portion, the following formula is established:

$$\frac{I_s^0 + \sum_{i=1}^{n} I_s^i}{I_b^0 \sum_{i=1}^{n} I_b^i} = \frac{s}{ab} \quad (2)$$

With respect to $I_b^0$ and $I_s^0$, a formula is obtained by Fraunhofer's approximation (i.e., the approximation based on the fact that the wave surface of either the incident or emergent light can be regarded as a plane) of the Fresnel-Kirchoff's formula, and is defined in the limitation when $x_i$ and $y_i$ go to 0 to give the following formula:

$$I^0 = \left| \lim_{\substack{x_i \to 0 \\ y_i \to 0}} U(x_i, y_i) \right|^2 \quad (3)$$

$$= \left| (1/j\lambda Z i) \exp(jkZi) \iint_{-a}^{+a} g(x_0, y_0) dx_0 dy_0 \right|^2$$

where $g(x_0, y_0)$, $U(x_i, y_i)$ respectively represent the light intensity distributions at points $(x_0, y_0)$ and $(x_i, y_i)$ on the orifice surface and the diffraction pattern surface; j, the imaginary unit; and k the wave vector $(2\pi/\lambda)$.

Since the double integral portion represents the orifice area having $g(x, y) = 1$, that is, a uniform light intensity distribution, $I^0$ is proportional to the square of the orifice area. Accordingly, the following formula holds:

$$\frac{I_s^0}{I_b^0} = \frac{s^2}{ab^2} \quad (4)$$

From the above formulae (1), (2) and (4), the following formulae are given:

$$\frac{s^2}{I_s^0} = \frac{ab^2}{I_b^0} = \frac{sb}{\Sigma I_s^n} = \frac{asb}{\Sigma I_b^n} \quad (5)$$

$$\frac{sb}{I_s^n} = \frac{asb}{I_b^n} \quad (6)$$

From the formulae (5) and (6), the light intensity $I^0$ by the interference between $I_s^0$ and $I_b^0$ and the light intensity $I^n$ by the interference between $I_s^n$ and $I_b^n$ are obtained as follows:

$$I^0 = s^2 + ab^2 + 2\sqrt{\alpha} \, sb \cos(4\pi h/\lambda) \quad (7)$$

$$I^n = (1 + \alpha) sb - 2\sqrt{\alpha} \, sb \cos(4\pi h/\lambda) \quad (8)$$

From the formulae (7) and (8), intensity changes of $I^0$ and $I^n$, i.e., contrasts $C^0$ and $C^n$ are obtained as follows:

$$C^0 = \frac{2\sqrt{\alpha} \cdot sb}{s^2 + \alpha b^2} \quad (9)$$

$$C^n = \frac{2\sqrt{\alpha}}{1 + \alpha} \quad (10)$$

Accordingly, employment of the rth-order diffracted beam eliminates the decrease in contrast due to the area ratio. It is, however, impossible to prevent the decrease in contrast by the absorption within the pits.

In a second embodiment of the present invention, the contrast $C^n$ is improved on the basis of the finding that $\alpha$ is increased by using a He-Cd laser whose wavelength is shorter than that of a He-Ne laser.

Let us consider a case wherein, as the rth-order diffracted beam, first-order diffracted beam is detected.

The emergent angle $\theta_1$ of the first-order diffracted beam is given by the following formula:

$$\theta_1 = \sin^{-1}(\lambda/l) \quad (11)$$

Accordingly, the motor 15 is actuated so as to set the photodetector 32 at a position at which it can detect the light which is reflected to emerge at the above-described angle $\theta_1$.

Similarly, the emergent angle $\theta_n$ of the nth-order diffracted beam is given by the following formula:

$$\theta_n = \sin^{-1}(n \cdot (\lambda/l)) \quad (11')$$

As will be clear from the formula (11), when $l < \lambda$, no first-order diffracted beam is detected. Accordingly, in the case of a relatively small pattern, the wave length $\lambda$ of the irradiation must be reduced correspondingly. The employment of a He-Cd laser enables the pitch l to cope with a very fine pattern as small as 325 nm.

In this way, the beam of light to be detected is determined.

Figure 5:
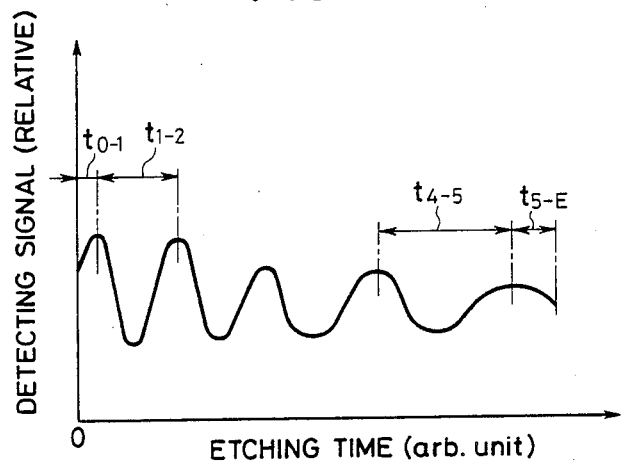
FIG. 5 shows a detecting signal obtained by the measuring apparatus according to the present invention.

As the etching is started, the signal shown in FIG. 5 is detected according to the formula (8), One period of this periodical signal is interpreted as the progress of etching to $\frac{1}{2}$ of a wave length of 325 nm.

The amount of etching $h_0$ effected from the beginning of the etching process to the first peak position is calculated by extrapolation from the time $t_{1-2}$ between the first peak position and the second peak position as follows:

$$h_0 = \frac{t_{0-1}}{t_{1-2}} \times \frac{325}{2} \, [nm] \quad (12)$$

In the above formula, $t_{l\,0-1}$ represents the time from the beginning of the etching process to the first peak position. The amount of etching made from the final peak position to the present etching position is also calculated by similar extrapolation.

Accordingly, as the wavelength of irradiation is reduced, the resolution is increased, and it becomes possible to calculate the etch depth with a higher degree of accuracy.

Figure 6:
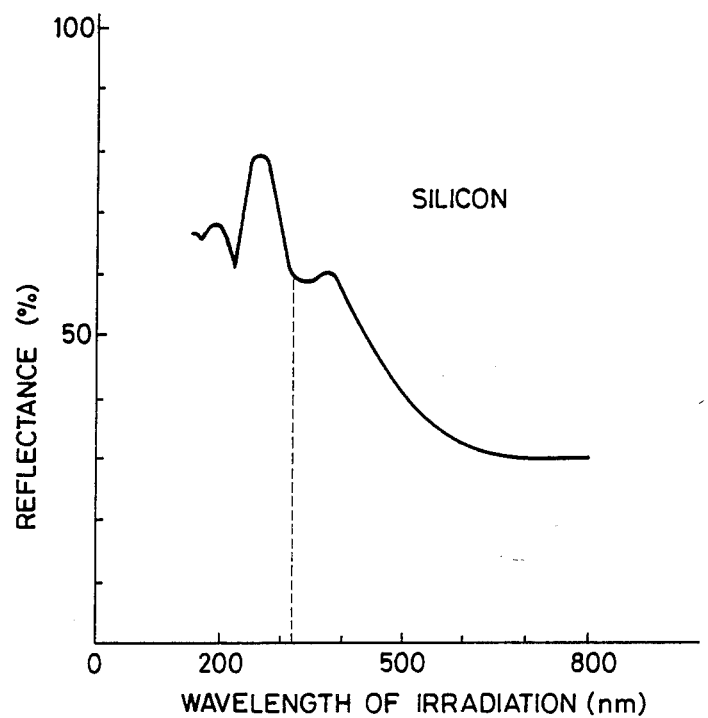
FIG. 6 is a graph showing changes in the reflectance of a single crystal silicon substrate.

FIG. 6 shows spectral characteristics of the reflectance of silicon. As will be seen from the graph, the reflectance increases near a wavelength of 300 nm, and this means that it is possible to increase $\alpha$ in the formula (10).

Although a He-Cd laser is employed in the above-described embodiment, it is also possible to employ a short wavelength laser such as a $N_2$ laser (337 nm) or an Ar laser (126 nm), and in such case, the contrast can be made greater than that in the case of a He-Ne laser.

What is claimed is:

1. An apparatus for measuring a depth of a fine pit or a fine groove on a substrate, comprising:

working means for forming a fine pit or a fine groove on a semiconductor substrate;

laser source means for generating a laser beam having a wavelength less than a predetermined wavelength so as to be a short wavelength;

optical means for radiating the short wavelength laser beam generated by the laser source means to a surface portion of the semiconductor substrate including at least one pit or groove formed by the working means and in a direction substantially perpendicular to a surface of the semiconductor substrate;

detection means for detecting an intensity of an interference light between light which is reflected by a bottom of the at least one pit or groove and diffracted by an orifice of the at least one pit or groove and light which is reflected and diffracted by the surface portion of the semiconductor substrate other than the at least one pit or groove, the detection means including a detector for converting the detected interference light to an electric signal; and computing means for calculating a depth of the at least one pit or groove formed by the working means in accordance with a time interval between peaks of the electric signal.

2. An apparatus according to claim 1, wherein the laser source means includes a laser source for generating a laser beam having a short wavelength less than the wavelength generated by a He-Ne laser source.

3. An apparatus according to claim 2, wherein the laser source includes a He-Cd laser source for generating a laser beam having a short wavelength of 325 nm.

4. An apparatus according to claim 2, wherein the laser source includes a $N_2$ laser source for generating a laser beam having a short wavelength of 337 nm.

5. An apparatus according to claim 2, wherein the laser source includes a Ar laser source for generating a laser beam having a short wavelength of 126 nm.

6. An apparatus according to claim 2, wherein the working means forms a fine pit or a fine groove having a width of less than 0.5 $\mu$m on the semiconductor substrate.

7. An apparatus according to claim 6, wherein the working means comprises an etching apparatus.

8. An apparatus according to claim 2, further comprising control means for controlling the working means in accordance with the depth of the at least one pit or groove calculated by the computing means.

9. An apparatus according to claim 2, wherein the detector is located substantially at a position at which light emerging from the surface portion of the semiconductor substrate with an emergent angle $\theta_n$ defined by $\theta_n = \sin^{-1} n \cdot (\lambda/l))$ is detected, where l is a pitch of a plurality of fine pits or fine grooves formed on the semiconductor substrate, $\lambda$ is a wavelength of the laser beam, and n is a positive integer.

10. An apparatus according to claim 2, wherein the semiconductor substrate comprises Si material.

* * * * *